United States Patent
Jochum et al.

(10) Patent No.: US 10,605,867 B2
(45) Date of Patent: Mar. 31, 2020

(54) TEST ARRANGEMENT AND METHOD FOR TESTING A SWITCHING SYSTEM

(71) Applicant: OMICRON ELECTRONICS GmbH, Klaus (AT)

(72) Inventors: Michael Jochum, Altach (AT); Stephan Geiger, Feldkirch (AT); Rainer Kueng, Raggal (AT)

(73) Assignee: OMICRON ELECTRONICS GMBH, Klauss (AT)

( * ) Notice: Subject to any disclaimer, the term of this patent is extended or adjusted under 35 U.S.C. 154(b) by 137 days.

(21) Appl. No.: 15/517,416

(22) PCT Filed: Sep. 29, 2015

(86) PCT No.: PCT/EP2015/072438
§ 371 (c)(1),
(2) Date: Apr. 6, 2017

(87) PCT Pub. No.: WO2016/055307
PCT Pub. Date: Apr. 14, 2016

(65) Prior Publication Data
US 2018/0238967 A1    Aug. 23, 2018

(30) Foreign Application Priority Data
Oct. 7, 2014   (AT) .................................. 50716/2014

(51) Int. Cl.
*G01R 31/327*   (2006.01)
*G01R 1/04*     (2006.01)

(52) U.S. Cl.
CPC ....... *G01R 31/3274* (2013.01); *G01R 1/0416* (2013.01); *G01R 31/3272* (2013.01)

(58) Field of Classification Search
CPC ............ G01R 31/2844; G01R 31/2846; G01R 31/2848; G01R 31/3274
See application file for complete search history.

(56) References Cited

U.S. PATENT DOCUMENTS 4,105,965 A * 8/1978 Russell .............. G01R 31/3277
                                                 324/424
4,814,712 A * 3/1989 Burton .................. H02H 3/044
                                                 324/424

(Continued)

FOREIGN PATENT DOCUMENTS

DE    10 2009 042 762    3/2011
DE    10 2012 004 848    9/2013

(Continued)

OTHER PUBLICATIONS

Anonymous, "Plug and Play", Wikipedia, XP055238085, Retrieved from the Internet: URL: https://de.wikipedia.org/w/index.php?title=Plug_and_Play&oldid-131448252, (Apr. 19, 2014).

(Continued)

*Primary Examiner* — Walter L Lindsay, Jr.
*Assistant Examiner* — Milton Gonzalez
(74) *Attorney, Agent, or Firm* — Greenblum & Bernstein, P.L.C.

(57) ABSTRACT

In order to test substations from different manufacturers and of different types in a simple manner, it is provided that a control unit (6) for a switching device (5) of a substation (4) is connected via an adapter cable (11) to a test device (10), which simulates the switching device (5) for the test and the test device (10) reads configuration-specific data from a memory unit (15) on the adapter cable (11) and the test unit (10) thus configures its signal inputs (BE) and signal outputs (BA, AA) that are required for conducting the test.

14 Claims, 3 Drawing Sheets

(56) References Cited

U.S. PATENT DOCUMENTS

| | | | | |
|---|---|---|---|---|
| 5,168,261 | A * | 12/1992 | Weeks | G01R 31/2848 |
| | | | | 324/424 |
| 6,795,789 | B2 * | 9/2004 | Vandiver | G01R 31/3272 |
| | | | | 702/120 |
| 7,259,565 | B2 | 8/2007 | Diercks et al. | |
| 8,983,820 | B2 | 3/2015 | Parapurath et al. | |
| 2004/0189309 | A1 * | 9/2004 | Bertness | G01R 31/3648 |
| | | | | 324/426 |
| 2005/0057254 | A1 | 3/2005 | Diercks et al. | |
| 2012/0239373 | A1 | 9/2012 | Parapurath et al. | |
| 2012/0244743 | A1 * | 9/2012 | Lukas | H01R 13/665 |
| | | | | 439/488 |

FOREIGN PATENT DOCUMENTS

| | | |
|---|---|---|
| EP | 1 515 411 | 3/2005 |
| EP | 2 273 278 | 1/2011 |
| EP | 2 523 007 | 11/2012 |
| WO | 2011/030190 | 3/2011 |
| WO | 2013/135344 | 9/2013 |

OTHER PUBLICATIONS

Austria Search Report conducted in counterpart Austria Appln. No. A 50716/2014 (dated Sep. 25, 2015).

* cited by examiner

TEST ARRANGEMENT AND METHOD FOR TESTING A SWITCHING SYSTEM

The present invention relates to a test set-up for a substation having a control unit for a switching device of the substation and a test device having a number of signal inputs and a number of signal outputs, wherein the control unit is connected to the test device via an adapter cable and the test device simulates the switching device for the test, and a related method for preparing a test of a substation.

A variety of security devices is used in installations for transmission or distribution of electrical power, for example, in an electrical supply network. Typical security devices are, for example, so-called automatic resetting devices (known under the English name "recloser") or circuit-breakers (known under the English name "sectionalizer"). A recloser monitors current and voltage of individual phases of an electrical installation among each other, but also to ground or neutral, and disconnects one or all phases if an electrical fault is detected in one phase, such as a high fault current caused by a short circuit to ground. After a specific, predetermined time, the previously disconnected phase is switched back in. If the fault remains, the disconnection and reconnection repeats for a predetermined number of attempts. A sectionalizer typically does not detect an electrical fault, but disconnects an electrical line based on other criteria, for example, after a specific number of known reconnection attempts by an upstream recloser. Electrical switches such as power breakers (also known as circuit-breakers) are also used in electrical installations. In general and hereinafter, such aforementioned devices are referred to as switching devices. It is common in such switching devices that they have a control unit that monitors and triggers the switching of the switching device based on specific control input variables, typically measured currents, often together with measured voltages as well. The switching device is thus controlled via control output variables in the form of electrical signals on a control line, for example.

In order to ensure the proper functioning of a control unit for a switching device, it is intended that these will be reviewed from time to time or at regular intervals. There are appropriate test devices for this that are connected to the control unit via a test cable and simulate the function of the switching device, such as a switching operation, the switch auxiliary contacts of a circuit-breaker, etc. The switching device is disconnected from the control unit for this and replaced by the test device that thereby simulates the switching device. The problem with this is that there is a wide variety of manufacturers of switching devices and control units that also use a large variety of electrical interfaces between these units, in the pin counts as well as in the pin assignment. This means that different adapter cables are necessary for the variety of electrical interfaces. It is therefore necessary to stock a variety of adapter cables in order to actually create a connection between the test device and the different control units. In addition, the signal inputs and signal outputs of the test device 10, which can be analog as well as digital, depending upon the switching device and the control unit, must be parameterized, for example, the voltage level, the timing of specific signals, the logical content of a digital 0 or 1, etc.

Using a signal output of the test device in the form of a binary output, a switch auxiliary contact can be simulated (position open or closed), for example, and with a signal input of the test device in the form of a binary input, a close/open command from the control unit is detected, for example. The signals to the binary inputs are typically voltages that vary in amplitude depending upon the switching device to be simulated. A DC voltage is most often used that either represents a control low voltage (such as 24V), or a voltage that is supplied from a large capacitance in the control unit (which mostly delivers a higher voltage, such as 48V, 155V or 240V) in order to directly operate the DC coil in the circuit-breaker. In the case of a binary input, for example, this signal input of the test device must be assigned a function and a start value (such as a voltage level).

In order to be able to simulate a switching device via the test device, other parameters of the switching device must be parameterized in the test device as well, for example, release times, closing times, auxiliary contact time delays, etc. For example, a signal generally exists on the binary input for less than 100 ms, whether as a trip (open) or close signal. This trip or close command can be an individual command for each phase (in the case of a multi-phase switching device), but there can also be a trip and close for each phase individually, if the switching device has this functionality. However, a temporal sequence of test device signal output states can also be configured in relation to the state changes of signal inputs. Previously, this important parameterization or configuration has been done manually by a user of the test device and the user had to know everything that had to be set in order to be able to carry out a proper test of the control unit. This means that an appropriate I/O interface for an input/output device, such as a laptop, a tablet or a control unit must be available on the test device in order to be able to input the required parameters and to configure the necessary settings. In addition, appropriate software must also be installed on the input/output device in order to be able to configure the test device to the appropriate requirements and to carry out the simulation of the switching device.

DE 109 2012 004 848 A1 offers an improvement to the cumbersome configuration of a test device. In it, a simulation device with a simulation module is described, wherein a firmware, in which the switching logic and the switching function of a circuit to be tested are simulated, can be installed in the simulation module Moreover, a configuration is stored in the simulation module that recognizes the type of switching device and determines an address in the testing software for identification and assignment. The simulation device is connected to the substation via a connector module. The test software for function testing is installed on an external computer connected to the simulator module via a wireless connection. In this way, a complete parameterization and configuration can be prepared and no longer needs to be done manually. However, if different switching devices and their control units need to be tested, different connector modules and differently configured simulation modules are needed for the different types of substations, or the necessary firmware must first be downloaded to the simulation module for each test.

U.S. Pat. No. 7,259,565 B2 shows a method for testing a substation with a switching device and a control unit. In this case, the configuration of the substation and the test parameters is stored in a memory unit in the control unit. A test device can be connected to the control unit and the test device reads the configuration and the test parameters from the memory unit. The problem with this method is that the memory unit can only be read with a test device provided for it, because the type and manner of how the configuration and the test parameters are stored in the memory unit and how they are to be read are manufacturer specific and are usually not even publicly documented. This, in turn, means that a variety of different, manufacturer-specific test devices would have to be stocked for different substations and for different manufacturers, which makes substation testing logistically very complex.

It is a task of the present invention to specify a test set-up and a method, by means of which substations from different manufacturers and of different types can be tested in the simplest manner.

This task is achieved according to the invention in that a memory unit is provided on the adapter cable in which configuration-specific data are stored and which can be read by the test device, and the test device is designed to automatically configure its signal inputs and signal outputs that are necessary for a test according to the configuration-specific data. This utilizes the circumstance that the substation can be closed via the adapter cable on the switching device. If configuration-specific data are now stored on the adapter cable, these can be read by the test device after connection of the test device and control unit via the adapter cable. This allows the test device to automatically configure itself using the configuration-specific data, which significantly reduces the effort for carrying out a test because no user intervention is required for preparation. Thus, possible errors in preparing the test can be avoided because the adapter cable only fits a specific combination of control unit and switching device, whereupon an incorrect configuration of the test device is practically eliminated.

According to the design, a unique identification can be stored in the adapter cable as configuration-specific data that makes it possible to read configuration data assigned from the configuration data memory for the configuration of required signal inputs and signal outputs. Alternately, configuration data can also be stored directly in the memory unit as configuration-specific data.

Particularly advantageously, primary configuration data for configuring at least one binary signal output are stored. This allows for a basic function test of the control unit to be carried out without depending upon external testing software and without having to configure possible additional signal inputs or signal outputs in a time-consuming manner. Thus, a conclusion can quickly be reached as to whether the control unit is operating at all.

By storing primary configuration data for configuring at least one binary signal input of the test device, the scope of the basic function test can be expanded in that the interaction between the control unit and the simulated switching device in the form of the test device, meaning the mutual response to one another, can also be tested.

For a complete function test, all binary signal inputs and binary signal outputs of the test device must be configured, which includes with it all necessary trip, close and switch auxiliary contact lines that are provided on the actual switching device.

For a more detailed parameter test, it can be provided that secondary configuration data are stored for configuring at least one analog signal output of the test device. This makes it possible to include currents and voltages of the substation in the test, making very comprehensive tests possible.

The present invention is explained below with reference to FIGS. 1 to 5, showing exemplary, schematic and non-restrictive advantageous embodiments of the invention. Shown are FIG. 1 a known arrangement of a substation, FIG. 2 an arrangement for testing the control unit of the substation.

Figure 1:
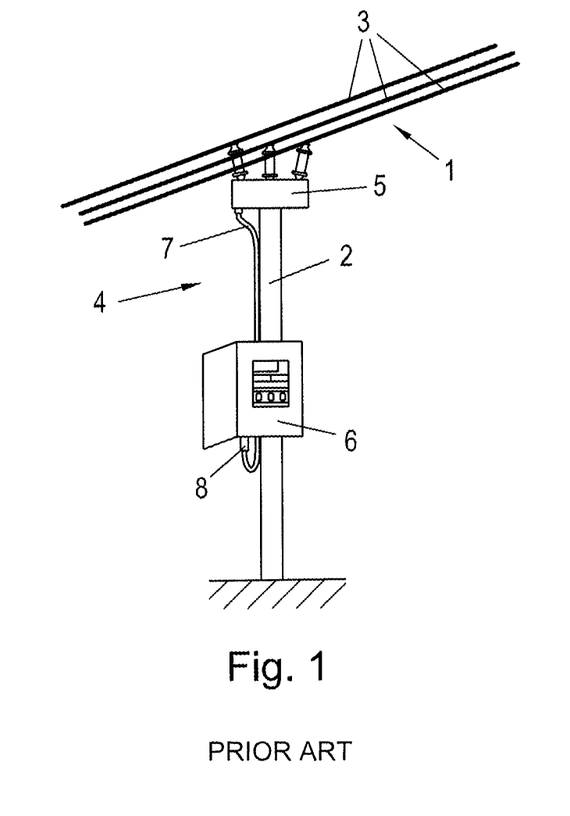

In FIG. 1, a section of an electrical supply network 1 is depicted: in the exemplary embodiment shown, a 3-phase overhead power transmission line whose lines 3 are tensioned between masts 2 in the customary manner. On mast 2, a substation 4 is provided as a security device and comprises a switching device 5 and a corresponding control unit 6. Switching device 5 is, for example, a recloser or a sectionalizer as initially described and can disconnect or connect at least one of lines 3 via a switching operation triggered by control unit 6. However, the invention is, of course, not limited to use in an electrical supply network 1 in the form of an overhead power transmission line, but can be used in any installation for transmission or distribution of electrical power in the form of a substation 4 having a switching device 5 and a corresponding control unit 6.

Switching device 5 is connected for this purpose to control unit 6 via a control connection 7 and a connector 8 on the end of control connection 7. Control connection 7 generally includes for this purpose a variety of control lines for control input variables and control output variables of control unit 6. Control input variables of control unit 6 are, for example, measured variables, in particular measured currents or voltages, of the installation for transmitting or distributing electrical power that are detected by switching device 5 or by measuring devices built into it, such as current transformers, and are transmitted to control unit 6 for evaluation. The control input variables typically also include signals from any auxiliary contacts of switching device 5 that might exist which signal a specific switching state (open, closed). Control output variables of control unit 6 are signals produced by control unit 6, in particular in reaction to the control input variables and via which the functions of switching device 5 are controlled, for example tripping a switching operation.

Figure 2:
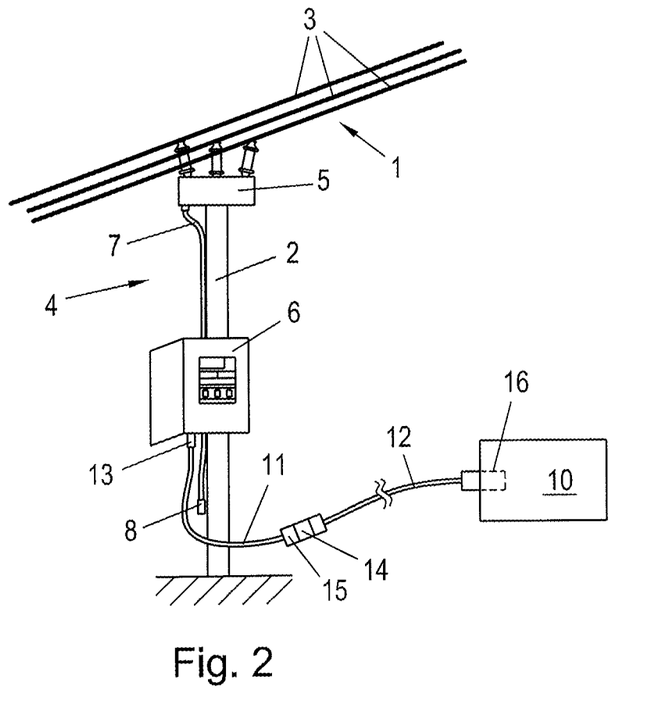

To test substation 4, control connection 7 between switching device 5 and control unit 6 is disconnected, in that connector 8 is pulled from control connection 7, as shown in FIG. 2. It would also be possible that switching device 5 is not connected at all to control unit 6 before the test, for example during initial start-up. The disconnection of control connection 7 would then be omitted. This is quite often the case because control units 6 are often parameterized before installation and then tested for function using test device 10 before it is brought "into the field" and installed.

Control unit 6 is connected for testing via an adapter cable 11 to a test device 10 that simulates switching device 5 in order to test the proper function and parameterization of control unit 6 of substation 4. Adapter cable 11 is connected to control unit 6 using a first connector 13 via an electrical interface 17. Connector 13 thus corresponds in its pin count and pin assignment and geometry to the requirements of control unit 6. Common control units 6 vary here between 10 and 42 pins Gm (FIG. 3a) with a variety of pin assignments. Accordingly, there are corresponding adapter cables 11 for different control units 6 (manufacturer, type, interface, model year, etc.) By a second connector 14 on the other end of adapter cable 11, adapter cable 11 is connected to test device 10. For this, a standardized electrical interface 16 having a defined number of pins Pn (FIG. 3a) and a defined pin assignment can be provided on test device 10. Pins Gm of the connection between control unit 6 and adapter cable 11 are thus allocated to pins Pn with a unified pin assignment on interface 16 of test device 10, meaning that pins Gm of interface 17 on control unit 6 are assigned to specific pins Pm on test device 10. Thus, any connection errors can be avoided at the outset because a correct assignment is ensured by the insertion of connectors 13, 14 of adapter cable 11.

In order to save costs, a long interface cable 12, for example, with a length of several meters, can be provided that is plugged into test device 10 at one end and at the other end is connected to adapter cable 11 via a plug connection, as shown in FIG. 2. Interface cable 12, can also be omitted, however. Via interface cable 12, interface 16 of test device 10 is brought closer to control unit 6, whereupon the necessary length of adapter cable 11 for different control units 6 can be reduced, preferably to a length of less than one meter. Thus, only short adapter cable 11 in different forms and only a single interface cable 12 needs to be stocked, in some cases different lengths of interface cable 12, which facilitates all of the logistics of the test.

Test device 10 thus serves to imitate or simulate switching device 5. To do this, test device 10 has a variety of signal inputs and signal outputs. Via the signal inputs, the test device receives control output variables from control unit 6 and via the signal outputs, control input variables of control unit 6 are set.

Switching device 5 usually has binary signal inputs and signal outputs. Switching operations are usually triggered via binary signal inputs, for example, from control unit 6. There can be separate signal inputs here for a trip signal (meaning opening switching device 5) and for a close signal (meaning closing switching device 5). A single binary signal input can also be used for trip and close, however. There are also switching devices 5 in which only one input for trip/close is used for all existing phases, and ones for which an input for trip/close is used for each individual phase of switching device 5. In addition, switching device 5 usually has switch auxiliary contacts in order to signal the switch state of switching device 5 via a binary signal output. Here again, separate switch auxiliary contacts can also be provided for open and closed, as well as, again, for all phases together, or for each phase, individually. In addition, switching device 5 also often has analog signal outputs, to which measured current or voltage values are transferred. Test device 10 must therefore be configured in order to simulate switching device 5 so that the signal inputs and signal outputs present in switching device 5 can be simulated. In this context, not all signal inputs or signal outputs are absolutely necessary and therefore do not necessarily need to be configured.

In switching device 5, switching operations having differently polarized signals are often indicated, that is, for example, +1 for close and −1 for trip, wherein 0 corresponds here to no switching operation. This is also considered as a binary input in terms of the present invention.

In order for test device 10 to be able to simulate switching device 5 for testing substation 4, it requires configuration data KD so that test device 10 can be adjusted accordingly. Configuration data KD can include information from electrical interface 17 of control unit 6 and/or information on the function of switching device 5. Data can be stored for electrical interface 17, such as the pin assignment of pins G1 . . . Gm at connector 13, the voltage level of different pins G1 . . . Gm of connector 13, information about analog or binary pins, the arrangement of pins G1 . . . Gm of connector 13 as control input variables or control output variables, the arrangement of pins G1 . . . Gm of electrical interface 17 of control device 6 to pins P1 . . . Pn of electrical interface 16 of test device 10, etc. The switch times or switching delays of the switches of switching device 5, nominal values of switching device 5 such as the transmission ratio of current and voltage converters, type of converter (such as conventional converter or Rogowski converter) and connected with it the configuration of test device 10, such as the correct selection of analog inputs AE and setting of a maximum value to protect control unit 6, etc. can be stored as configuration data KD relating to the function of switching device 5.

Figure 3A:
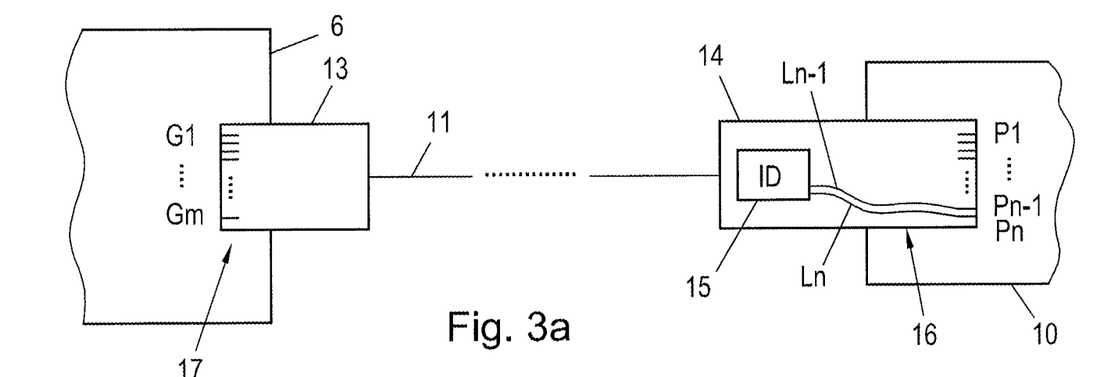
FIGS. 3a-3c illustrate possible arrangements of a memory unit to store configuration-specific data on the adapter cable, FIG. 4 a configured test set-up with control unit and test device and FIG. 5 an exemplary sequence of a test of the substation.
Figure 3B:
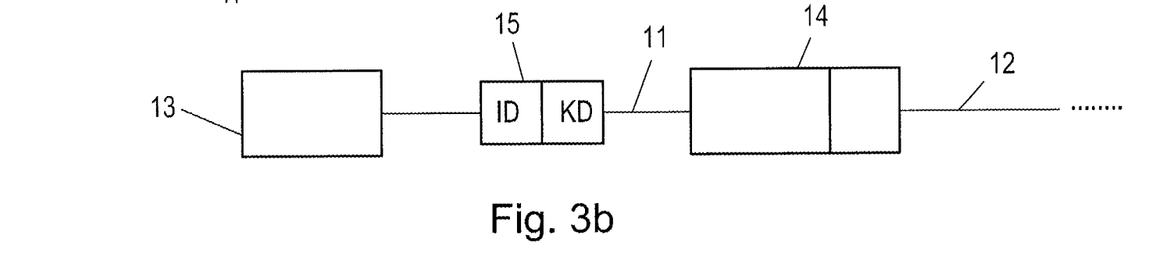
Figure 3C:
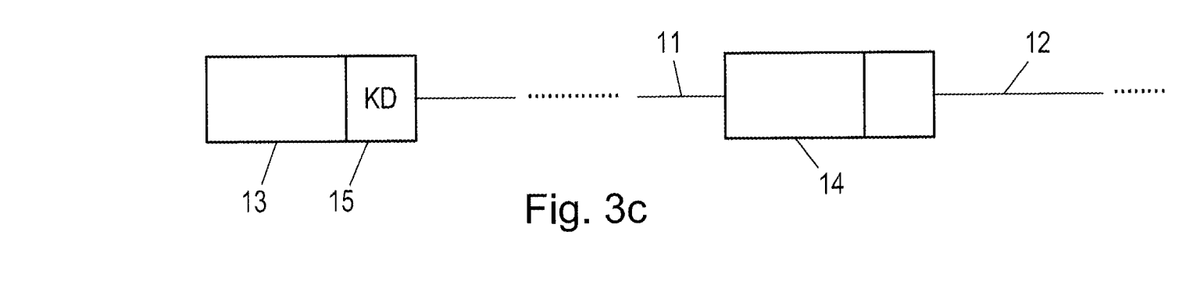

A memory unit 15, which must be designed specifically for a control unit as stated above, is arranged at the adapter cable 11. Memory unit 15 can be provided at different locations on adapter cable 11, as is indicated in FIGS. 3a to 3c. For example, memory unit 15 is provided in connector 14 for connecting adapter cable 11 to test device 10 (FIG. 3a) or to interface cable 12 (FIG. 2). Memory unit 15 can also be arranged at any given point on adapter cable 11 between two limiting connectors 13, 14 (FIG. 3b) and can also be arranged on connector 13 for connecting adapter cable 11 to control unit 6.

Memory unit 15 can be arbitrarily implemented here and must be only suitable for storing information. In the simplest case, memory unit 15 could be implemented as a passive electrical component, such as a resistance. If a defined polling voltage is applied to the electrical component, the latter then answers with an electric current as a function of the component. In this manner, different adapter cables 11, for example, can be easily identified. Memory unit 15 can also be implemented as an electronic storage module, however, that stores the information digitally.

Memory unit 15 only has to be readable by test device 10. Therefore, a number of pins Pn−1, Pn of interface 16 with test device 10 can be provided for reading memory unit 15, as indicated in FIG. 3a. Therefore, corresponding lines Ln−1, Ln (also in adapter cable 11) can also be provided, which connect pins Pn−1, Pn to memory unit 15. However, lines of adapter cable 11, which are themselves necessary for testing control unit 6, can also be used, for example, if control unit 6 is switched beforehand to a read-out mode. Any data transfer method can be implemented to read memory unit 15 using a data transfer protocol of choice, if necessary.

In memory unit 15 are stored configuration-specific data, meaning data that describe the configuration and function of substation 4. Aforementioned configuration data KD (FIG. 3c), a unique identification ID of adapter cable 11 (FIG. 3a) or a combination of these (FIG. 3b) can be stored as configuration-specific data.

If configuration data KD are directly stored in memory unit 15 as configuration-specific data, test device 10 reads configuration data KD and automatically configures itself using these configuration data KD.

If a unique identification ID of adapter cable 11 is stored in memory unit 15, test device 10 reads this identification ID. For a given switching device 5 there can be associated control units 6 from different manufacturers that must necessarily, however, have the same electrical interface for switching device 5. The same type of adapter cable 11 can thus be used for these control units 6 from different manufacturers. Certain configuration data KD necessary for the test can in some circumstances be derived partially or even completely from the cable type of adapter cable 11, which is determined based on the unique identification ID without having to know the exact make of control unit 6. For example, the allocation of binary signal inputs and binary signal outputs to test device 10 and their timing settings relate not to the type of control unit 6, but only to the simulating switching device 5. Thus, just by knowing the type of adapter cable 11, certain basic settings can already be configured in test device 10. Identification ID of adapter cable 11 can thus already be sufficient to set up test device 10 for basic functional tests.

Figure 4:
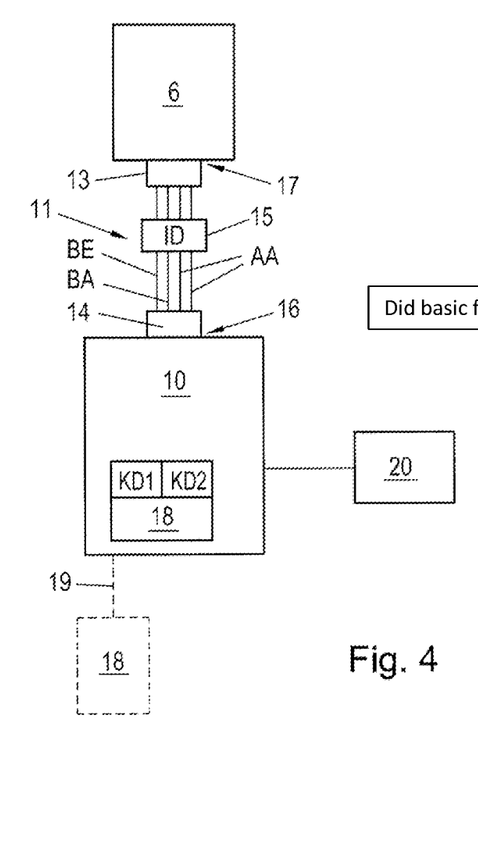

For this purpose, required configuration data KD of an identification ID for adapter cable 11 can be stored in test device 10 in a configuration data memory 18, which can then be used after reading identification ID from memory unit 15 in order to adjust test device 10 for testing substation 4. The necessary configuration data KD associated with identification ID do not have to be stored directly in test device 10, but can also be deposited in an external configuration data memory 18 allotted to identification ID (as shown in FIG. 4). To do this, test device 10 can connect to configuration data memory 18 via data connection 19, such as LAN, WLAN, Bluetooth, etc., and read the necessary data so as to thereby configure itself.

Of course, any preferred mixture of these two methods is conceivable, meaning that certain configuration data KD are stored directly in memory unit 15 and other configuration data KD are polled using the stored unique identification ID.

Figure 5:
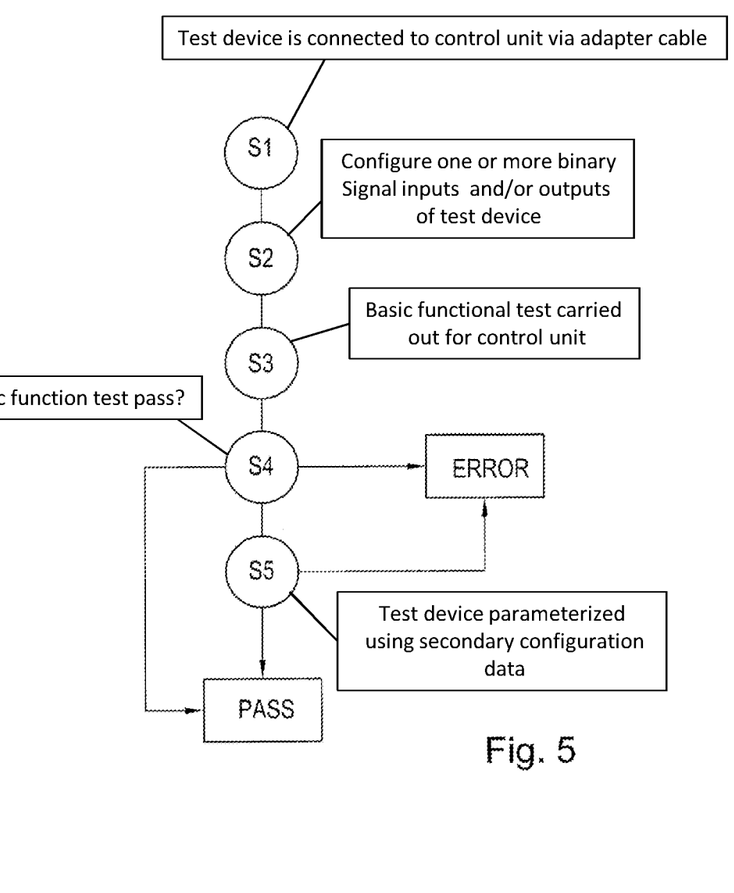

The sequence for a test of a substation 4 having a switching device 5 and a corresponding control unit 6 can, for example, run as referred to in FIGS. 4 and 5, as follows, wherein it is already assumed that test device 10 as described above is connected to control unit 6 via an adapter cable 11 (step S1).

An identification ID that clearly identifies the type of adapter cable 11 is stored in memory unit 15 of adapter cable 11. Configuration data KD (for example, which pins are used on electrical interfaces 16, 17, voltage level, switch auxiliary contact times, etc.) for all available adapter cables 11 and the assignment of unique identifications ID are stored in test device 10 in configuration data memory 18. If test device 10 is switched on, test device 10 automatically reads identification ID from memory unit 15, and a switching device simulator, for example in test device 10, is started, in this case a circuit-breaker simulator for a circuit-breaker as switching device 5, and, using primary configuration data KD1 stored as identification ID, accordingly automatically configures binary signal inputs BE (in some cases only one input) and/or binary signal outputs BA (in some cases only one output) of test device 10 (step S2). This includes, for example, assigning specified pins PN for the binary signal inputs and signal outputs BE, BA of interface 16 on test device 10 to particular pins GM of interface 17 on control unit 6, as well as the definition of the logical content of a binary 0 or 1, meaning, for example, 0=no trip, 1=trip or 0=no close, 1=closed binary input, or 0=open, 1=closed binary signal inputs, but also the voltage level of binary signal inputs and signal outputs BE, BA. In addition, the timing of binary signal inputs BE and/or binary signal outputs BA are determined using the stored primary configuration data KD1, for example, how long a trip command must be applied on a binary signal input BE of test device 10, or how long switching device 5 needs for switching, which is signaled as a binary signal output BA.

Of course, instead of an identification ID, these basic primary configuration data KD1 can also be stored directly in memory unit 15 and read from there directly by test device 10.

Using this basic configuration, a basic functional test can also be carried out for control unit 6 (step S3) in order to test whether control unit 6 reacts at all correctly to events signaled by test device 10. Here, for example, the following tests are conceivable:

Most switching devices 5 have manually operated switching handles that enable switching device 5 to be mechanically switched by hand, meaning to open or close it. The respective switch position is thus signaled via the switch auxiliary contacts to associated binary outputs of switching of device 5 to control unit 6. That can now be simulated in the basic functional test using the switching device simulator in test device 10. TRIP and CLOSE buttons, by means of which a specific switch position can be signaled on the binary signal outputs BA, can be provided on test device 10 for this purpose. All phases can thus be switched with one button simultaneously, or individual buttons could also be available for the different phases. It is therefore sufficient, if at least one binary signal output BA of test device 10 is configured.

Depending upon the manner and type of switching devices 5, it may, of course, also be necessary to configure a plurality of binary signal outputs BA of test device 10 for a basic functional test. In any case, for a functional test, there must be a valid signal on all binary signal outputs BA, the configuration of which is specified by control unit 6. If switching device 5, for example, has a switch auxiliary contact for the trip indicator and a switch auxiliary contact for the close indicator, the corresponding binary signal outputs BA must then always be opposed, meaning open at trip would cause a closed at close. There are also switching devices 5, however, having only one switch auxiliary contact. In this case, a binary signal output BA would be sufficient. However, if one assumes a 3-phase switching device 5 that can be operated as 1 phase (meaning one switching operation necessarily switches all phases simultaneously), then one single binary signal output is not sufficient because the other phases must also have a valid state that must be signaled accordingly.

For the basic functional test, however, switches or buttons present on control unit 6 could also be used for manually tripping a switching operation. The switching operation requested by control unit 6 is thus signaled to test device 10 using a binary signal input that subsequently switches the associated phase (or all phases, as appropriate). The switching operation carried out is signaled to control unit 6 via binary signal output BA of test device 10, also corresponding to the stored timings for the switch auxiliary contacts, as necessary.

For a basic functional test of this type, one is therefore fully independent of an external test software and from the configuration of other, in particular analog, signal inputs and/or signal outputs. If this basic functional test fails step S4), it becomes superfluous to conduct further tests and the test can be discontinued with a fault report.

For a test continuing beyond the basic functional test, insofar as such is required, test device 10 must be parameterized using additional, secondary configuration data KD2 as necessary in order to be able to simulate switching device 5 in its entire functionality (step S5). In this context, test device 10, in particular, must be adjusted so that other possible analog signal outputs AA of test device 10 are properly parameterized. Using analog signal outputs AA, voltages or currents, for example, are transmitted to control unit 6 that are measured on the actual switching device 5 and that are subsequently simulated for the test by test device 10. A current and/or voltage amplifier can be installed in test device 10 for this purpose that must be parameterized (for example, which amplifier is used, voltage/current range, nominal values, etc.) so that the currents and voltages necessary for simulating switching device 5 can be delivered. Measurement sensors also built into switching device 5, such as current transformers or voltage transformers, can be simulated in test device 10, which can also make parameterization necessary (for example, the transformer ratio of a current transformer, the measurement range of a voltage sensor, etc.).

Secondary configuration data KD2 required for this can again be read out of a configuration data memory 18 via unique identification ID or can be read directly out of memory unit 15 as long as they are stored there.

Depending upon the functionality of control unit 6, there could be more or fewer analog signal inputs AE and/or analog signal outputs AA to be parameterized. Therefore, it may be necessary for this type of test to select the specific control unit 6 used if there can be a plurality of control units 6 for a specific identification ID. This choice can be offered to the user of test device 10.

Using analog signal outputs AA, more complex tests of control unit 6 can be conducted (step S5) that also include current and/or voltage values of the individual phases of switching device 5. A special test software is necessary to conduct such more-extensive tests and can be installed either on test device 10 or on an external control device 20 (for example, a PC, laptop, table, etc.). In this context, a variety of test plans can be called up and processed, even automatically, the results of which (fault ERROR or successfully completed PASS) can also be recorded.

If one now wants to test current and voltage inputs for control unit 6, the user can use external control unit 20 and can connect via either a wireless or wired connection to test device 10. Once the connection is established, test device 10 shares with the test software which adapter cable 11 (identification ID) is connected. Identification ID of adapter cable 11 is then used in the test software and, using a table stored in the test software, automatically chooses the corresponding control unit 6 or offers the user a list of possible control units 6 to choose from. Control units 6 usually have a basic configuration that can then be preloaded to preconfigure test device 10. If necessary, the configuration is supplemented or completed by the user.

The basic idea of the method according to the invention, then, is that a user can perform at least basic functional tests on the control unit 6 independent of additional test software without needing to fully configure or parameterize test device 10. This enables the rapid testing of basic functions before an expensive, complete configuration is carried out. For additional tests, for example during commissioning or during a complete routine test, the test process is greatly simplified because control unit 6 is automatically selected in the test software based on identifying adapter cable 11 and test device 10 is at least preconfigured. If a plurality of control units 6 is assigned to one adapter cable 11, the user's selection of the correct control unit 6 can at least be substantially reduced and thus simplified.

The invention claimed is:

1. A test device and connected adapter cable for a control unit of a switching device of a substation, the test device being connectable to the control unit via the adapter cable, the test device comprising:
   a number of signal inputs;
   a number of signal outputs; and
   wherein the test device simulates the switching device,
   wherein a storage unit connected to the adapter cable stores configuration-specific data to be read by the test device, and
   wherein at least one of the number of signal inputs and at least one of the number of signal outputs are automatically configurable to perform a test according to the configuration-specific data.

2. The test device and adapter cable according to the claim 1, wherein a unique identification of the adapter cable is stored as configuration-specific data and the test device further comprises a configuration data storage, in which configuration data for configuring the at least one of the number of signal inputs and the at least one of the number of signal outputs are stored.

3. The test device and adapter cable according to claim 2, wherein primary configuration data are stored for configuring the at least one of the number of signal outputs as at least one binary signal output.

4. The test device and adapter cable according to claim 2, wherein primary configuration data are stored for configuring the at least one of the number of signal inputs as at least one binary signal input.

5. The test device and adapter cable according to claim 2, wherein secondary configuration data are stored for configuring the at least one of the number of signal outputs as at least one analog signal output.

6. The test device and adapter cable according to claim 1, wherein configuration data for configuring the at least one of the number of signal inputs and the at least one of the number of signal outputs are stored as configuration-specific data.

7. A method for testing a control unit of a switching device in a substation with the test device and connected adapter cable according to claim 1, the method comprising:
   connecting the adapter cable to the control unit.

8. The method according to claim 7, wherein, before connecting the adapter cable to the control unit, the method further comprises disconnecting the control unit from the switching device.

9. A method to prepare a test of a control unit of a switching device in a substation, the method comprising:
   connecting a test device having a number of signal inputs and a number of signal outputs to the control unit using an adapter cable;
   simulating the switching device by the test device,
   reading, in the test device, configuration-specific data from a storage unit on the adapter cable; and
   configuring in the test device at least one of the number of signal inputs and at least one of the number of signal outputs for performing the test.

10. The method according to claim 9, further comprising reading a unique identification of the adapter cable as the configuration-specific data from the storage unit; and
   reading in configuration data for configuring the at least one of the number of signal inputs and the at least one of the number of signal outputs from a configuration data storage.

11. The method according to claim 10, wherein the configuration data includes primary configuration data, and the method further comprises configuring the at least one of the number of signal outputs as at least one binary signal output of the test device based on the primary configuration data.

12. The method according to claim 10, wherein the configuration data includes primary configuration data, and the method further comprises configuring the at least one of the number of signal inputs as at least one binary signal input of the test device based on the primary configuration data.

13. The method according to claim 10, wherein the configuration data includes secondary configuration data, and the method further comprises configuring the at least one of the number of signal outputs as at least one analog signal output of the test device based on the secondary configuration data.

14. The method according to claim 9, further comprising reading configuration data for configuring the at least one of the number of signal inputs and the at least one of the number of signal outputs from the storage unit as the configuration-specific data.

\* \* \* \* \*